US011249008B2

(12) United States Patent
Ichinose et al.

(10) Patent No.: US 11,249,008 B2
(45) Date of Patent: Feb. 15, 2022

(54) PEELING AND GRASPING APPARATUS, PEELING INSPECTION APPARATUS, AND ULTRASONIC VIBRATION BONDING SYSTEM

(71) Applicant: Toshiba Mitsubishi-Electric Industrial Systems Corporation, Chuo-ku (JP)

(72) Inventors: Akihiro Ichinose, Tokyo (JP); Yoshihito Yamada, Tokyo (JP)

(73) Assignee: Toshiba Mitsubishi-Electric Industrial Systems Corporation, Chuo-ku (JP)

( * ) Notice: Subject to any disclaimer, the term of this patent is extended or adjusted under 35 U.S.C. 154(b) by 144 days.

(21) Appl. No.: 16/647,670

(22) PCT Filed: Jun. 28, 2019

(86) PCT No.: PCT/JP2019/025798
§ 371 (c)(1),
(2) Date: Mar. 16, 2020

(87) PCT Pub. No.: WO2020/261529
PCT Pub. Date: Dec. 30, 2020

(65) Prior Publication Data
US 2021/0262919 A1    Aug. 26, 2021

(51) Int. Cl.
*G01N 19/04*    (2006.01)
*G01L 5/00*    (2006.01)
*H01L 21/607*    (2006.01)

(52) U.S. Cl.
CPC ............ *G01N 19/04* (2013.01); *G01L 5/0033* (2013.01); *G01L 5/0028* (2013.01); *G01N 2203/0091* (2013.01); *H01L 21/607* (2021.08)

(58) Field of Classification Search
CPC ............ G01N 19/04; G01N 2203/0091; G01L 5/0033; G01L 5/0028; H01L 21/607
See application file for complete search history.

(56) References Cited

U.S. PATENT DOCUMENTS

| 3,524,345 A | * | 8/1970 | Isaacson | ............ G01N 19/04 73/150 A |
| 2012/0103081 A1 | * | 5/2012 | Hoshino | ............ G01N 19/04 73/150 A |

(Continued)

FOREIGN PATENT DOCUMENTS

JP    2006-194599 A    7/2006

OTHER PUBLICATIONS

International Search Report dated Sep. 24, 2019 in PCT/JP2019/025798 filed on Jun. 28, 2019.

*Primary Examiner* — Jonathan M Dunlap
(74) *Attorney, Agent, or Firm* — Oblon, McClelland, Maier & Neustadt, L.L.P.

(57) ABSTRACT

First and second operations are executed under control of a peeling inspection control apparatus functioning as a peeling and grasping control unit. In the first operation, a processed surface contact state in which a processed outer peripheral surface of a contact roller and a surface of a lead wire are in contact with each other is maintained, and contact roller rotation operation is executed in which the contact roller is moved on the surface of the lead wire while the contact roller is being rotated. During execution of the first operation, a tip portion of the lead wire is peeled from a glass substrate. Thereafter, in the second operation, grasping operation is executed in which the tip portion of the lead wire peeled from the glass substrate is grasped by a grasping mechanism.

4 Claims, 6 Drawing Sheets

(56) References Cited

U.S. PATENT DOCUMENTS

2015/0260636 A1* 9/2015 Ao .................. G01N 19/04
 73/827
2015/0330884 A1* 11/2015 Spinella .............. G01N 3/08
 73/827

* cited by examiner

PEELING AND GRASPING APPARATUS, PEELING INSPECTION APPARATUS, AND ULTRASONIC VIBRATION BONDING SYSTEM

TECHNICAL FIELD

The present invention elates to a peeling and grasping apparatus that is used in a peeling inspection apparatus and peels a measuring object bonded to a surface of a substrate from the substrate and grasps the measuring object.

BACKGROUND ART

An apparatus used for manufacturing solar cells or the like is, for example, an ultrasonic vibration bonding apparatus that bonds, by ultrasonic vibration operation, a bonding object such as an electrode wire onto a substrate on which a solar cell or the like is provided.

In addition, an existing force gauge is used to quantitatively evaluate peeling strength that is adhesion between the bonding object bonded onto the substrate and the substrate. Hereinafter, a processing procedure of a peeling strength measuring method using a force gauge will be described.

First, a tip portion of a bonding object is manually peeled, and one end of the peeled bonding object is grasped by a predetermined grasping member.

Then, a force gauge is coupled and attached to the grasping member so that tension applied to the force gauge can be measured.

Thereafter, the grasping member and the force gauge are lifted by using a predetermined lifting mechanism while the one end of the bonding object is being grasped, and the tension applied to the force gauge during the lift is measured. In this way, peeling strength of the bonding object can be measured.

An apparatus for measuring the peeling strength of the bonding object as described above is, for example, a peeling test apparatus disclosed in Patent Document 1.

PRIOR ART DOCUMENT

Patent Document

Patent Document 1: Japanese Patent Application Laid-Open No. 2006-194599

SUMMARY

Problem to be Solved by the Invention

As described above, the conventional method of measuring peeling strength, in which a bonding object bonded by ultrasonic vibration operation or the like serves as a measuring object, has required a preparation process of manually peeling a part of the measuring object from a substrate and attaching the part to a grasping member by a manual process.

The preparation process is mainly a manual process by hand, and thus there is a problem that this process requires relatively much time and labor. Further, there is also a problem that measurement accuracy of the peeling strength is unstable because the preparation process includes a manual process.

An object of the present invention is to provide a peeling and grasping apparatus that solves the above-described problems and peels a measuring object from a substrate and grasps the measuring object, without requiring a manual process.

Means to Solve the Problem

A peeling and grasping apparatus according to the present invention is a peeling and grasping apparatus that executes a peeling and grasping process for peeling and grasping a measuring object bonded onto a substrate in a predetermined direction, the peeling and grasping apparatus including: a chucking hand mechanism; a moving mechanism configured to execute horizontal moving operation for moving the chucking hand mechanism in a horizontal direction and vertical moving operation for moving the chucking hand mechanism in a vertical direction; and a peeling and grasping control unit configured to control the chucking hand mechanism and the moving mechanism to control execution of the peeling and grasping process, in which the chucking hand mechanism includes a contact roller having a processed outer peripheral surface that is a part of an outer peripheral surface and that is processed to be uneven, a grasping mechanism configured to perform grasping operation in conjunction with rotation operation of the contact roller, and a pressurizing mechanism configured to execute lowering operation of the contact roller and pressurizing operation for pressurizing the contact roller downward while the measuring object is in contact with the contact roller, and the peeling and grasping process executed under the control of the peeling and grasping control unit includes the steps of (a) causing the moving mechanism to execute the horizontal moving operation and the vertical moving operation to dispose the contact roller above a tip portion of the measuring object, (b) causing the pressurizing, mechanism to execute the lowering operation to bring the outer peripheral surface of the contact roller into contact with a surface of the measuring object and causing the pressurizing mechanism to execute the pressurizing operation to set a processed surface contact state in which the processed outer peripheral surface of the contact roller and the surface of the measuring object are in contact with each other, and (c) causing the moving mechanism to execute the horizontal moving operation while maintaining the processed surface contact state and executing contact roller rotation operation for moving the contact roller in the predetermined direction on the surface of the measuring object while rotating the contact roller, the tip portion of the measuring object being peeled from the substrate during execution of the step (c), and the peeling and grasping process further includes (d) a step of causing the grasping mechanism to execute the grasping operation for grasping the tip portion of the measuring object peeled from the substrate.

Effects of the Invention

The peeling and grasping apparatus according to the present invention executes the above-described peeling and grasping process including the steps (a) to (d) under the control of the peeling and grasping control unit, thereby automatically peeling the measuring object from the substrate and causing the grasping mechanism to grasp the tip portion of the measuring object, without requiring a manual process.

Objects, features, aspects, and advantages of the present invention will be more apparent from the following detailed description and the accompanying drawings.

DESCRIPTION OF EMBODIMENT

<Apparatus Configuration>

Figure 1:
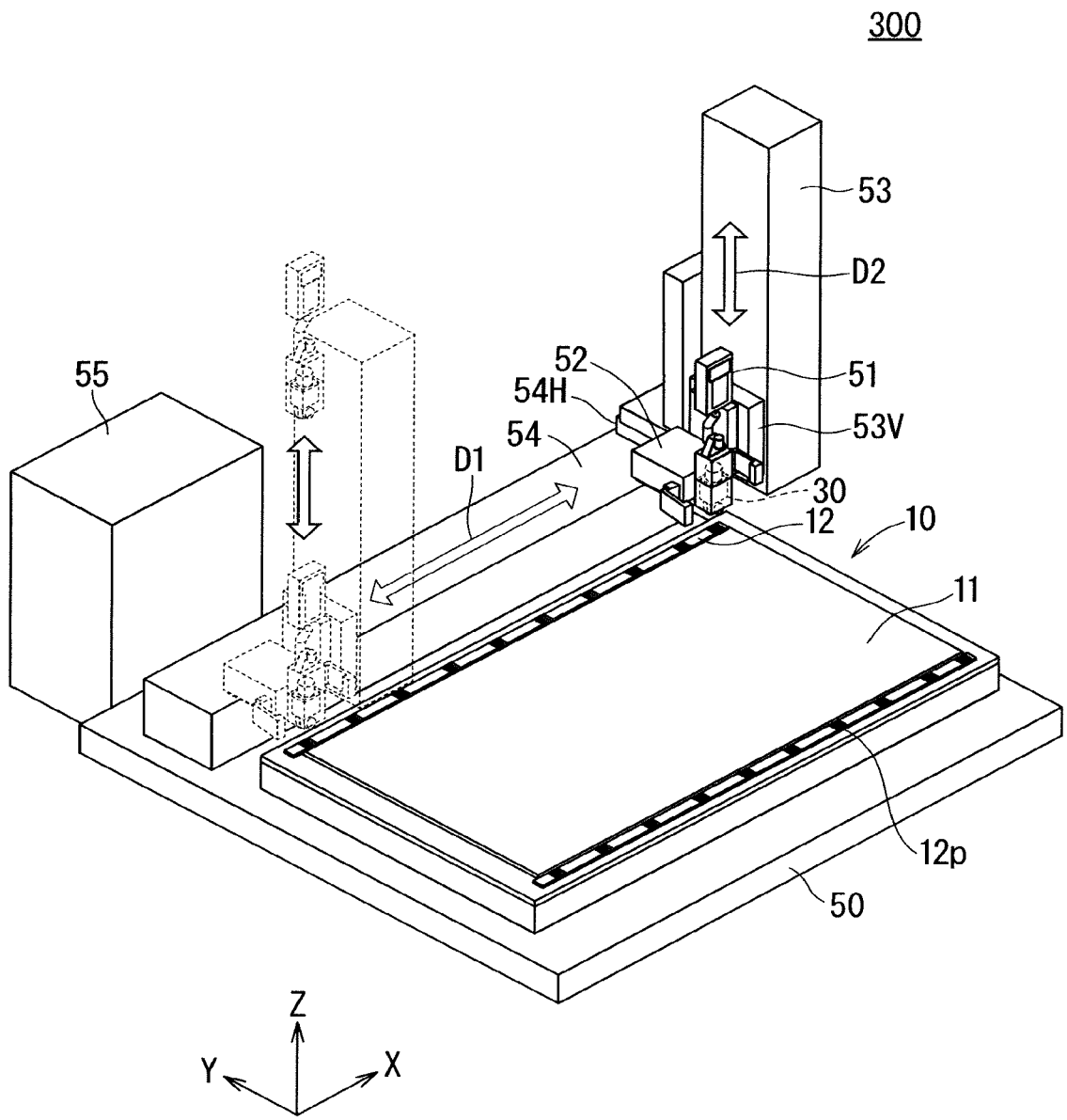
FIG. 1 is a perspective view schematically showing an overall configuration of a peeling inspection apparatus including a peeling and grasping apparatus according to an embodiment.

FIG. 1 is a perspective view schematically showing an overall configuration of a peeling inspection apparatus 300 including a peeling and grasping apparatus according to an embodiment. FIG. 1 shows an XYZ rectangular coordinate system. In addition, FIGS. 2 to 6 shown below also show the XYZ rectangular coordinate system.

As shown in FIG. 1, a substrate table 10 and a horizontal transfer machine 54 are placed on a placing table 50, and a glass substrate 11 is provided on the substrate table 10. Two lead wires 12 are ultrasonically bonded in an X direction to both ends along a Y direction of a surface of the glass substrate 11. Thus, the lead wires 12 bonded in the X direction (predetermined direction) onto the glass substrate 11 that is a substrate are measuring objects.

Figure 6:
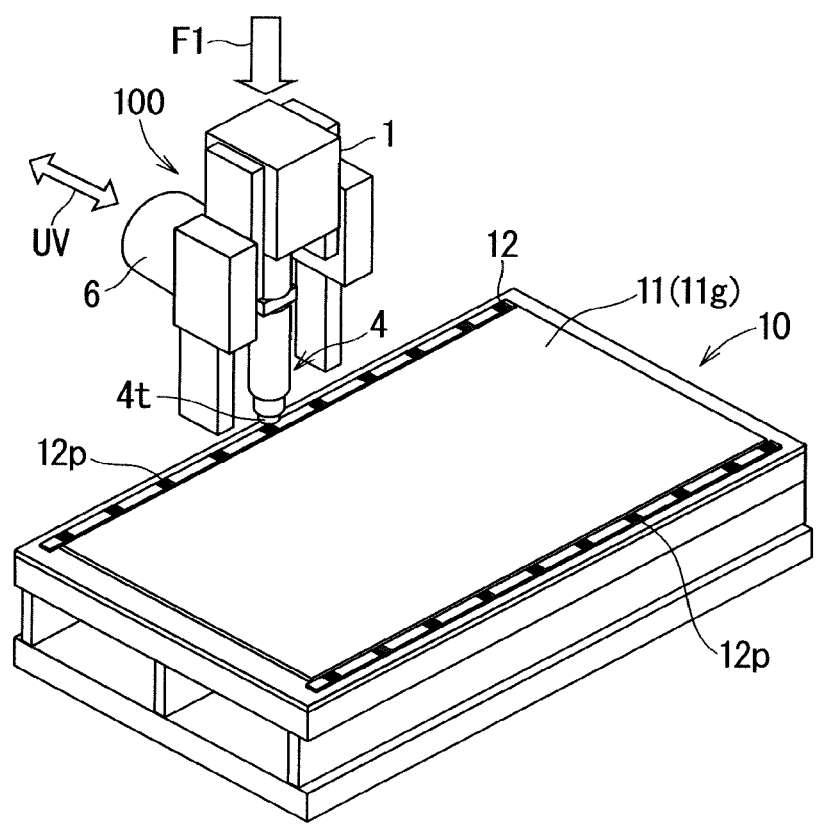
FIG. 6 is a perspective view schematically showing a configuration of an ultrasonic vibration bonding apparatus.

FIG. 6 is a perspective view schematically showing a configuration of a general ultrasonic vibration bonding apparatus 100. As shown in FIG. 6, the glass substrate 11 is disposed on the substrate table 10, and conductive lead wires 12 are bonded onto a solar cell thin film 11g that is the uppermost layer of the glass substrate 11. Thus, each lead wire 12 disposed in the X direction (predetermined direction) on the glass substrate 11 (solar cell thin film 11g) that is a substrate is a bonding object.

As shown in FIG. 6, the ultrasonic vibration bonding apparatus 100 includes a bonding tool 4, and the bonding tool 4 has a contact tip portion 4t at its lower tip portion.

Ultrasonic vibration generated by an ultrasonic vibrator (not shown) is transmitted to the bonding tool 4 via the vibration horn unit 6.

In the ultrasonic vibration bonding apparatus 100 having such a configuration, ultrasonic vibration operation is executed by the ultrasonic vibration bonding apparatus 100 while the lead wire 12 that is a conductive electrode wire is being disposed in the X direction on the glass substrate 11 (solar cell thin film 11g).

The ultrasonic vibration operation is executed in which ultrasonic vibration UV generated by the ultrasonic vibrator and obtained via the vibration horn unit 6 is applied onto ultrasonic bonding points 12p of the lead wire 12 through the contact tip portion 4t of the bonding tool 4 while the bonding tool 4 is applying a predetermined pressure toward the substrate table 10 to the lead wire 12 by using drive force F1.

As a result, the lead wire 12 can be bonded onto the surface (of the solar cell thin film 11g) of the glass substrate 11 at the ultrasonic bonding points 12p.

Referring back to FIG. 1, the peeling inspection apparatus 300 includes a chucking hand mechanism 30, a force gauge 51, a vertical transfer machine 53, the horizontal transfer machine 54, and a peeling inspection control apparatus 55 as main components.

The chucking hand mechanism 30 and the force gauge 51 serving as a peeling strength measuring instrument are coupled with each other, and the force gauge 51 can measure peeling strength of the lead wire 12 serving as the measuring object as described in detail below.

The vertical transfer machine 53 includes a handling unit 53V that is movable in a vertical direction D2 (Z direction), and the force gauge 51 is coupled with the vertical transfer handling unit 53V.

Therefore, it is possible to execute vertical moving operation in which the vertical transfer machine 53 moves the handling unit 53V in the vertical direction D2 to move the chucking hand mechanism 30 and the force gauge 51 in the vertical direction D2.

The horizontal transfer machine 54 includes a horizontal transfer handling unit 54H that is movable in a horizontal direction D1 (X direction), and a handling unit 52 for grasping a chuck ring grasps the chucking hand mechanism 30 when the chucking hand mechanism 30 is disposed at a predetermined lower position. As a result, the chucking hand mechanism 30 is coupled with the handling unit 52. The handling unit 52 is coupled with the horizontally moving handling unit 54H. Note that, in a case where the chucking hand mechanism 30 does not exist at the predetermined lower position, the handling unit 52 releases the chucking hand mechanism 30, without grasping the chucking hand mechanism 30. That is, the handling unit 52 has no coupling relationship with the chucking hand mechanism 30. Therefore, the handling unit 52 does not move in the vertical direction (Z direction).

Thus, in a case where the chucking hand mechanism 30 is disposed at the predetermined lower position, it is possible to execute horizontal moving operation in which the horizontal transfer machine 54 moves the handling unit 52 and the handling unit 54H in the horizontal direction D1 to move the chucking hand mechanism 30, the force gauge 51, and the vertical transfer machine 53 together in the horizontal direction D1.

As described above, the vertical transfer machine 53 and the horizontal transfer machine 54 function as a moving mechanism that can execute the vertical moving operation or horizontal moving operation in which the chucking hand mechanism 30 and the force gauge 51 serving as moving objects are moved in the vertical direction D2 or horizontal direction D1.

The peeling inspection control apparatus 55 mainly controls the chucking hand mechanism 30, the vertical transfer machine 53, and the horizontal transfer machine 54, and functions as a peeling and grasping control unit that controls execution of a peeling and grasping process for peeling and grasping the lead wire 12 serving as the measuring object.

The peeling inspection control apparatus 55 mainly controls the chucking hand mechanism 30, the force gauge 51, the vertical transfer machine 53, and the horizontal transfer machine 54, includes the above-described peeling and grasping process, and also functions as a peeling strength measuring control unit that controls execution of a peeling strength measuring process for measuring the peeling strength (bonding strength) between the lead wire 12 and the glass substrate 11.

Therefore, a part excluding the function of the peeling strength measuring control unit in the force gauge 51 and the peeling inspection control apparatus 55 from the peeling inspection apparatus 300 is the peeling and grasping apparatus of the embodiment.

Figure 2:
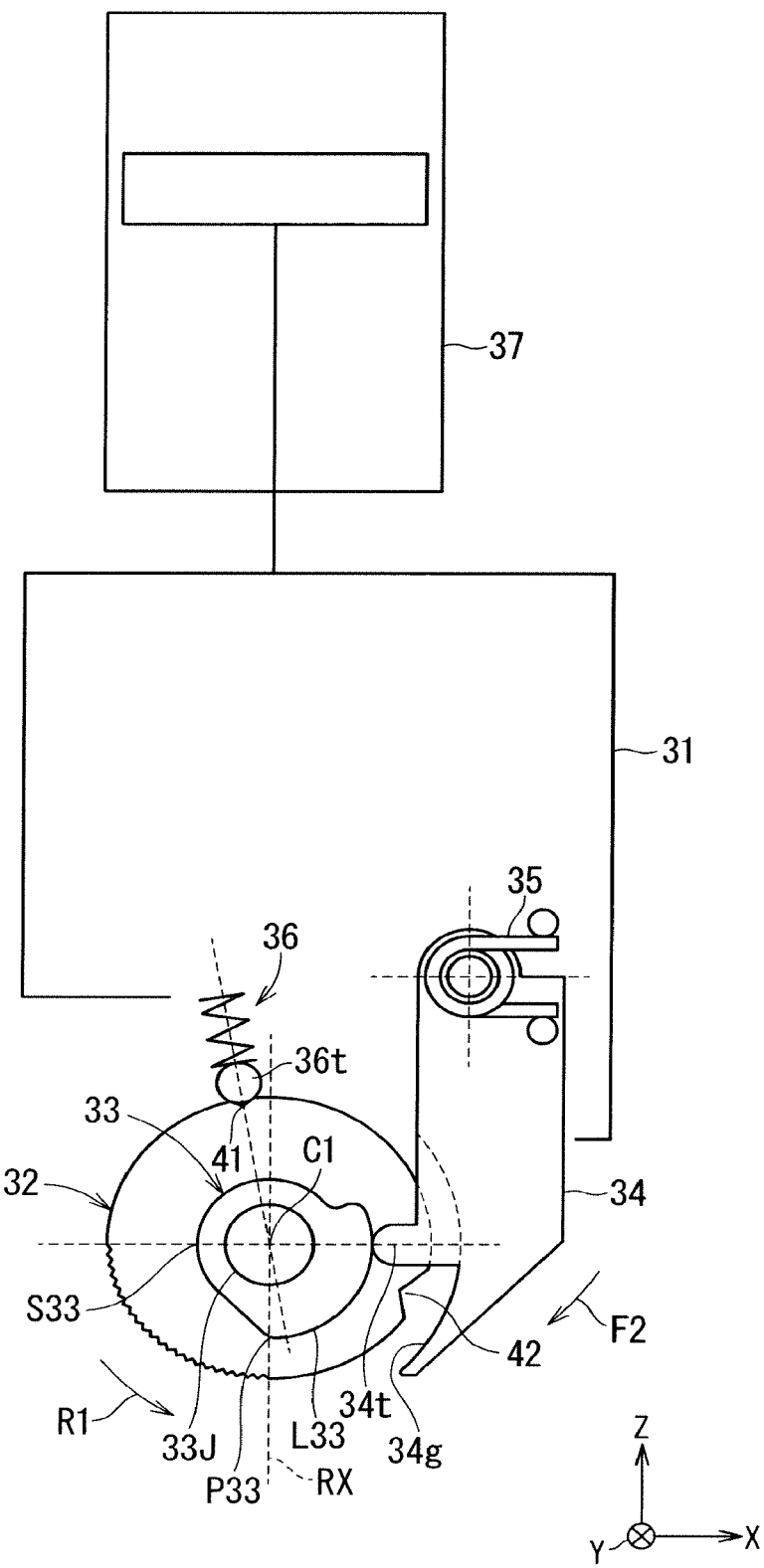
FIG. 2 is an explanatory view schematically showing an overall configuration of a chucking hand mechanism shown in FIG. 1.

FIG. 2 is an explanatory view schematically showing an overall configuration of the chucking hand mechanism 30. As shown in FIG. 2, the chucking hand mechanism 30 includes a pressurizing mechanism 37 and a chucking hand main body 31 as main components.

The chucking hand main body 31 includes a contact roller 32, a contact roller interlocking cam 33, an electrode wire fixing metal member 34, a spring 35, and a rotation lock mechanism 36 as main components.

The pressurizing mechanism 37 performs lowering operation for moving the chucking hand main body 31 downward, lifting operation for moving the chucking hand main body 31 upward, and pressurizing operation for, after the contact roller 32 is brought into contact with a surface of the lead wire 12 serving as the measuring object, pressurizing the surface of the lead wire 12 by using the contact roller 32. The pressurizing mechanism 37 can be, for example, a cylinder.

The contact roller 32 is rotatably attached to the chucking hand main body 31. The contact roller 32 has a substantially circular shape in plan view on the XZ plane, and has an outer peripheral surface having a width of approximately 5 mm. Rotation operation of the contact roller 32 is rotation operation in a rotation direction R1 around a center point C1.

The contact roller interlocking cam 33 is integrally coupled with the contact roller 32 by a coupling member 33J so as to perform rotation operation in conjunction with the rotation operation of the contact roller 32. The rotation operation of the contact roller interlocking cam 33 is, similarly to the contact roller 32, rotation operation in the rotation direction R1 around the center point C1.

The contact roller interlocking cam 33 has a short-diameter outer peripheral surface S33 that is a first outer peripheral surface having a first radius and a long-diameter outer peripheral surface L33 that is a second outer peripheral surface having a second radius longer than the first radius. The contact roller interlocking cam 33 has a shape having an arc of the first radius and an arc of the second radius in plan view on the XZ plane.

The rotation lock mechanism 36 is a mechanism for positioning and fixing the contact roller 32, has a lock mechanism tip portion 36t at its tip portion, and has a spring component that applies fixing elastic force to the lock mechanism tip portion 36t.

The contact roller 32 is positioned at a first stop position at which the lock mechanism tip portion 36t of the rotation lock mechanism 36 is brought into contact with a positioning groove 41 and a second stop position at which the lock mechanism tip portion 36t is brought into contact with a positioning groove 42.

Note that the positioning grooves 41 and 42 each have a V shape in plan view on the XZ plane, and the positioning groove 42 has a deeper formation depth than the positioning groove 41.

Thus, the rotation lock mechanism 36 can lock the rotation operation of the contact roller 32 and fix the contact roller 32 at the first or second stop position. When the contact roller 32 is fixed at the first and second stop positions, the rotation lock mechanism 36 applies the fixing elastic force to the lock mechanism tip portion 36t in a direction toward the center point C1 of the contact roller 32.

The electrode wire fixing metal member 34, which is a fixing member, has a protruding end 34t protruding in a direction (−X direction in FIG. 2) toward the short-diameter outer peripheral surface S33 and the long-diameter outer peripheral surface L33 of the contact roller interlocking cam 33.

The electrode wire fixing metal member 34 is provided to face the outer peripheral surface of the contact roller 32, and further has a grasping surface 34g having a shape matching with a part of the outer peripheral surface of the contact roller 32.

The spring 35 is attached to the chucking hand main body 31 so as to apply spring applying force F2 to the electrode wire fixing metal member 34. The spring applying force F2 has a vector component in a direction in which the grasping surface 34g faces the outer peripheral surface of the contact roller 32, and is grasping force for grasping a peeled tip portion of the lead wire 12.

As shown in FIG. 2, in a case where the contact roller 32 is stopped at the first stop position, an end region of the long-diameter outer peripheral surface L33 of the contact roller interlocking cam 33 is brought into contact with the protruding end 34t. Further, a boundary point P33 between the long-diameter outer peripheral surface L33 and the short-diameter outer peripheral surface S33 is positioned to face substantially downward.

Therefore, in FIG. 2, the long-diameter outer peripheral surface L33 is provided on the right side (+X, direction side) of the boundary point P33, and the short-diameter outer peripheral surface S33 is provided on the left side (−X direction side) of the boundary point P33.

Herein, when a coordinate axis extending downward (−Z direction) in the coordinate system based on the center point C1 that is a rotation center of the contact roller 32 is set as a reference axis RX, an angle between the boundary point P33 and the reference axis RX is almost 0 degrees.

Figure 3:
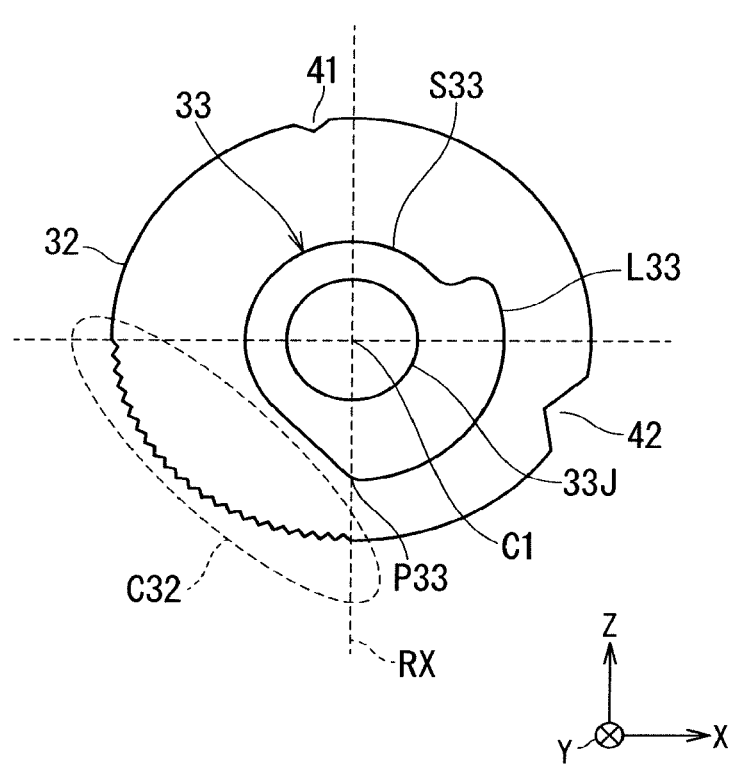
FIG. 3 is an explanatory view showing details of a contact roller and a contact roller interlocking cam shown in FIG. 2.
Figure 4:
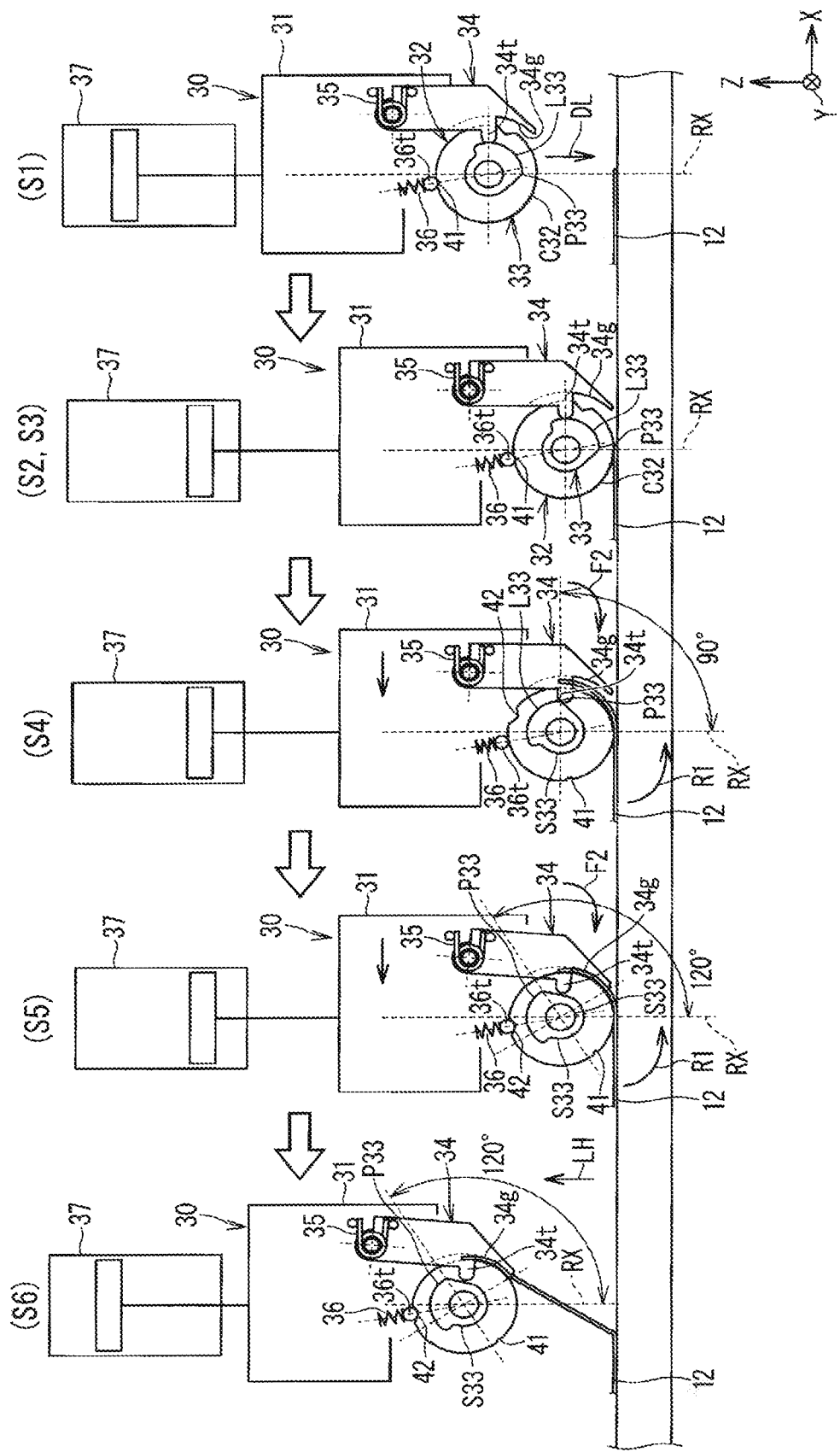
FIGS. 4A to 4E are explanatory views schematically showing processing content of a peeling and grasping process executed under the control of a peeling inspection control apparatus.

FIG. 3 is an explanatory view showing details of the contact roller 32 and the contact roller interlocking cam 33. As shown in FIG. 3, the contact roller 32 has a processed outer peripheral surface C32 obtained by performing a knurl-like uneven process on a ¼ part of a circumferential portion of the outer peripheral surface thereof.

When the contact roller 32 is at the first stop position at which the lock mechanism tip portion 36t is brought into contact with the positioning groove 41, the processed outer peripheral surface C32 is positioned at a lower left ¼ part of the circumferential portion in FIG. 3. That is, when the contact roller 32 is at the first stop position, the contact roller 32 has the processed outer peripheral surface C32 in a region of 0 degrees to −90 degrees based on the reference axis RX.

When the contact roller 32 is at the first stop position, the long-diameter outer peripheral surface L33 of the contact roller interlocking cam 33 is positioned in a region from a lower right ¼ part of the circumferential portion in FIG. 3 to a part of an upper right portion in FIG. 3. That is, when the contact roller 32 is at the first stop position, the contact roller interlocking cam 33 has the long-diameter outer peripheral surface L33 in a region of 0 degrees to 120 degrees based on the reference axis RX.

FIGS. 4A to 4E are explanatory views schematically showing processing content of the peeling and grasping process executed under the control of the peeling inspection control apparatus 55 functioning as the peeling and grasping control unit. Hereinafter, the peeling and grasping process will be described with reference to FIGS. 4A to 4E.

The contact roller 32 is fixed at the first stop position by the rotation lock mechanism 36 as an initial state. Therefore, in the initial state, the processed outer peripheral surface C32 is positioned in the region from 0 degrees to −90 degrees based on the reference axis RX, and the boundary point P33 of the contact roller interlocking cam 33 is positioned near 0 degrees from the reference axis RX.

In step S1 in FIG. 4A, the vertical transfer machine 53 is caused to perform the vertical moving operation in the vertical direction D2, and the horizontal transfer machine 54 is caused to perform the horizontal moving operation in the horizontal direction D1, and thus the contact roller 32 fixed at the first stop position is disposed above the tip portion of the lead wire 12 serving as the measuring object.

Next, in step S2 in FIG. 4B, the pressurizing mechanism 37 is caused to execute the lowering operation to lower the chucking hand main body 31 in a downward direction DL, and thus the outer peripheral surface of the contact roller 32 is brought into contact with the surface of the lead wire 12 serving as the measuring object.

Thereafter, in step S3 in FIG. 4B, the pressurizing mechanism 37 is caused to execute the pressurizing operation, and thus there is set a processed surface contact state in which the processed outer peripheral surface C32 of the contact roller 32 and the surface of the lead wire 12 are in contact with each other. Note that step S3 is continuously executed subsequently to step S2.

Further, in step S4 in FIG. 4C, the horizontal transfer machine 54 is caused to execute the horizontal moving operation in the −X direction while the processed surface contact state is being maintained, and contact roller rotation operation for moving the chucking hand mechanism 30 is executed in the X direction (predetermined direction) on the surface of the lead wire 12 while rotating the contact roller 32 in the rotation direction R1.

Note that, because the formation depth of the positioning groove 41 is relatively shallow, the contact roller 32 is released from the fixed state at the first stop position by the rotation lock mechanism 36 due to execution of the above-described contact roller rotation operation, and smoothly rotates in the rotation direction R1.

The angle between the reference axis RX and the boundary point P33 of the contact roller interlocking cam 33 changes from 0 degrees to 90 degrees due to the above-described contact roller rotation operation, and a tip portion on the right side (+X direction side) of the processed outer peripheral surface C32 also moves from 0 degrees to 90 degrees based on the reference axis RX.

During the execution of step S4, the tip portion of the lead wire 12 serving as the measuring object is peeled from the glass substrate 11. Hereinafter, a peeling phenomenon of the lead wire 12 will be described.

When the contact roller 32 is rotated in the rotation direction R1 while the pressurizing operation is being executed by the pressurizing mechanism 37 and the processed surface contact state in which the surface of the lead wire 12 that is an electrode wire and the processed outer peripheral surface C32 are in contact with each other is being maintained, a knurl-like deformation occurs on the surface of the lead wire 12 due to the processed outer peripheral surface C32, and, at the same time, internal stress acts on the lead wire 12 itself due to pressurization.

As a result, the tip portion of the lead wire 12 that has been in contact with the processed outer peripheral surface C32 warps upward (+Z direction), and thus there occurs the peeling phenomenon in which the tip portion of the lead wire 12 is peeled from the glass substrate 11. This peeling phenomenon is particularly remarkable when the lead wire 12 is made from a relatively soft material such as aluminum. A constituent material of the lead wire 12 may be not only aluminum described above but also, for example, copper.

Further, the processed outer peripheral surface C32 is formed in an approximately ¼ region of the outer peripheral surface of the contact roller 32, and thus a length in an outer peripheral direction of the processed outer peripheral surface C32 is substantially equal to a peeling length that is a length at which the lead wire 12 is peeled.

When step S4 is executed, the long-diameter outer peripheral surface L33 of the contact roller interlocking cam 33 and the protruding end 34t of the electrode wire fixing metal member 34 are in contact with each other. Thus, a gap in which the peeled tip portion of the lead wire 12 is allowed to enter and exist is secured between the outer peripheral surface of the contact roller 32 and the grasping surface 34g of the electrode wire fixing metal member 34. Note that the boundary point P33, similarly to the long-diameter outer peripheral surface L33, substantially has the second radius from the center point C1 and is therefore included in the long-diameter outer peripheral surface L33.

Thus, during the execution of step S4, the peeled tip portion of the lead wire 12 automatically enters the gap between the outer peripheral surface of the contact roller 32 and the grasping surface 34g.

Thereafter, in step S5 in FIG. 4D, a first contact state in which the protruding end 34t of the electrode wire fixing metal member 34 is in contact with the long-diameter outer peripheral surface L33 of the contact roller interlocking cam 33 changes to a second contact state in which the protruding end 34t is in contact with the short-diameter outer peripheral surface S33 due to the contact roller rotation operation.

Immediately before the first contact state changes to the second contact state, the tip portion of the lead wire 12 having approximately the above peeling length enters the gap formed between the outer peripheral surface of the contact roller 32 and the grasping surface 34g. This is because a circumferential length of the long-diameter outer peripheral surface L33 of the contact roller interlocking cam 33 is set so that an end of the processed outer peripheral surface C32 of the contact roller 32 is brought into contact with the surface of the lead wire 12 at a timing at which the first contact state changes to the second contact state.

When the first contact state changes to the second contact state, a grasping mechanism including the contact roller 32, the contact roller interlocking cam 33, the electrode wire fixing metal member 34, and the spring 35 executes grasping operation for grasping the tip portion of the lead wire 12 peeled from the glass substrate 11. Hereinafter, the grasping operation by the grasping mechanism will be described in detail.

During the execution of step S5, the short-diameter outer peripheral surface S33 of the contact, roller interlocking cam 33 and the protruding end 34t of the electrode wire fixing metal member 34 are brought into contact with each other. Then, the grasping operation is executed by sandwiching the tip portion (predetermined length) of the lead wire 12 existing in the gap between the outer peripheral surface of the contact roller 32 and the grasping surface 34g of the electrode wire fixing metal member 34. The spring applying force F2, which is grasping force, is always applied to the electrode wire fixing metal member 34, and thus the peeled tip portion of the lead wire 12 can be stably grasped by the outer peripheral surface of the contact roller 32 and the grasping surface 34g of the electrode wire fixing metal member 34.

Thus, the grasping mechanism that grasps the peeled tip portion of the lead wire 12 is achieved by a combination of (the processed outer peripheral surface C32 of) the contact roller 32, the contact roller interlocking cam 33, the electrode wire fixing metal member 34, and the spring 35.

During the execution of step S5, the rotation operation of the contact roller 32 in the rotation direction R1 is stopped at the second stop position at which the lock mechanism tip portion 36t is brought into contact with the positioning groove 42. A formation groove of the positioning groove 42 is relatively deep, and thus the contact roller 32 is fixed at the second stop position, without rotating, even in a case where the chucking hand main body 31 is moved in the horizontal direction. Thereafter, the horizontal operation by the horizontal transfer machine 54 is immediately stopped.

Further, a circumferential length of the grasping surface 34g of the electrode wire fixing metal member 34, which corresponds to a part of the outer peripheral surface of the contact roller 32, is set to be approximately the same as the above-described peeling length (formation length of the processed outer peripheral surface C32).

Therefore, the grasping mechanism including the grasping surface 34g of the electrode wire fixing metal member 34 can stably grasp the peeled tip portion of the lead wire 12.

Further, when the contact roller 32 is at the second stop position, the boundary point P33 of the contact roller interlocking cam 33 is positioned at an angle of 120 degrees from the reference axis RX.

As described above, the peeling and grasping apparatus according to the embodiment executes steps S1 to S5 described with reference to FIGS. 4A to 4D under the control of the peeling inspection control apparatus 55 functioning as the peeling and grasping control unit, thereby executing the peeling and grasping process for peeling the tip portion of the lead wire 12 from the glass substrate 11 and grasping the peeled tip portion of the lead wire 12.

Further, the peeling inspection apparatus 300 including the peeling and grasping apparatus according to the embodiment causes the pressurizing mechanism 37 to execute the lifting operation in step S6 shown in FIG. 4E after execution of the peeling and grasping process, thereby lifting the chucking hand main body 31 in a lifting direction LH while grasping the tip portion of the lead wire 12.

Finally, when the peeled tip portion of the lead wire 12 becomes vertical to a horizontal plane (XY plane) of the glass substrate 11, i.e., when the peeled tip portion of the lead wire 12 is set to extend in the +Z direction, the force gauge 51 can accurately measure the peeling strength of the lead wire 12.

The peeling and grasping apparatus according to the embodiment executes the above-described peeling and grasping process including the steps S1 to S5 under the control of the peeling inspection control apparatus 55 functioning as the peeling and grasping control unit, thereby automatically peeling the lead wire 12 serving as the measuring object from the glass substrate 11 and causing the above-described grasping mechanism to grasp the tip portion of the lead wire 12, without requiring a manual process by hand.

Further, the first contact state in which the protruding end 34t of the electrode wire fixing metal member 34 that is a fixing member and the long-diameter outer peripheral surface L33 of the contact roller interlocking cam 33 are in contact with each other is achieved during the execution of step S4 in conjunction with the contact roller rotation operation of the contact roller 32. Then, during the execution of step S5, the first contact state changes to the second contact state in which the protruding end 34t of the electrode wire fixing metal member 34 and the short-diameter outer peripheral surface S33 of the contact roller 32 are in contact with each other.

Because the first contact state transitions to the second contact state, it is possible to, after the tip portion of the lead wire 12 is peeled from the glass substrate 11 in step S4, reliably execute the grasping operation for grasping the peeled tip portion of the lead wire 12 in step S5.

<Peeling Inspection Apparatus>

The peeling inspection apparatus 300 includes the peeling and grasping apparatus according to the embodiment, and further includes the force gauge 51. In addition, the peeling inspection control apparatus 55 of the peeling inspection apparatus 300 functions as the peeling strength measuring control unit that controls the force gauge 51 to control execution of the peeling strength measuring process for measuring the peeling strength of the lead wire 12 serving as the measuring object.

Therefore, the peeling strength measuring process executed under the control of the peeling inspection control apparatus 55 functioning as the peeling strength measuring control unit includes the following steps S11 and S12.

In step S11, the peeling and grasping process is executed by the peeling and grasping apparatus according to the embodiment.

In step S12, after the execution of step S11, the chucking hand mechanism 30 is released from the handling unit 52, and the peeling strength of the lead wire 12 is measured by using the force gauge 51. At this time, the force gauge 51 is coupled with the handling unit 53V. Therefore, the chucking hand mechanism 30 and the force gauge 51 are released from the horizontal moving operation performed by the horizontal transfer machine 54 that is one of moving mechanisms, the handling unit 54H, and the handling unit 52.

Note that the peeling strength of the lead wire 12 is measured as follows. When the chucking hand mechanism 30 and the force gauge 51 are lifted by the vertical transfer machine 53, tension measured by the force gauge 51 is measured. This tension is the peeling strength of the lead wire 12. Note that, when the chucking hand mechanism 30 and the force gauge 51 are lifted, the peeled tip portion of the lead wire 12 is desirably set in the vertical direction (Z direction). Further, there may be adopted a modification example in which the chucking hand mechanism 30 and the force gauge 51 are lifted by an independent lifting mechanism different from the vertical transfer machine 53. In this case, during the execution of step S12, the chucking hand mechanism 30 and the force gauge 51 are released from the vertical moving operation by the vertical transfer machine 53 and the horizontal moving operation by the horizontal transfer machine 54.

The peeling inspection apparatus 300 executes the above-described peeling strength measuring process including steps S11 and S12 under the control of the peeling inspection control apparatus 55 functioning as the peeling strength measuring control unit.

Therefore, the peeling inspection apparatus 300 can automatically perform a series of processes in which the tip portion of the lead wire 12 is peeled and grasped by the chucking hand mechanism 30 and then the peeling strength of the lead wire 12 is measured by using the force gauge 51 serving as the peeling strength measuring instrument.

<Ultrasonic Vibration Bonding Apparatus>

Figure 5:
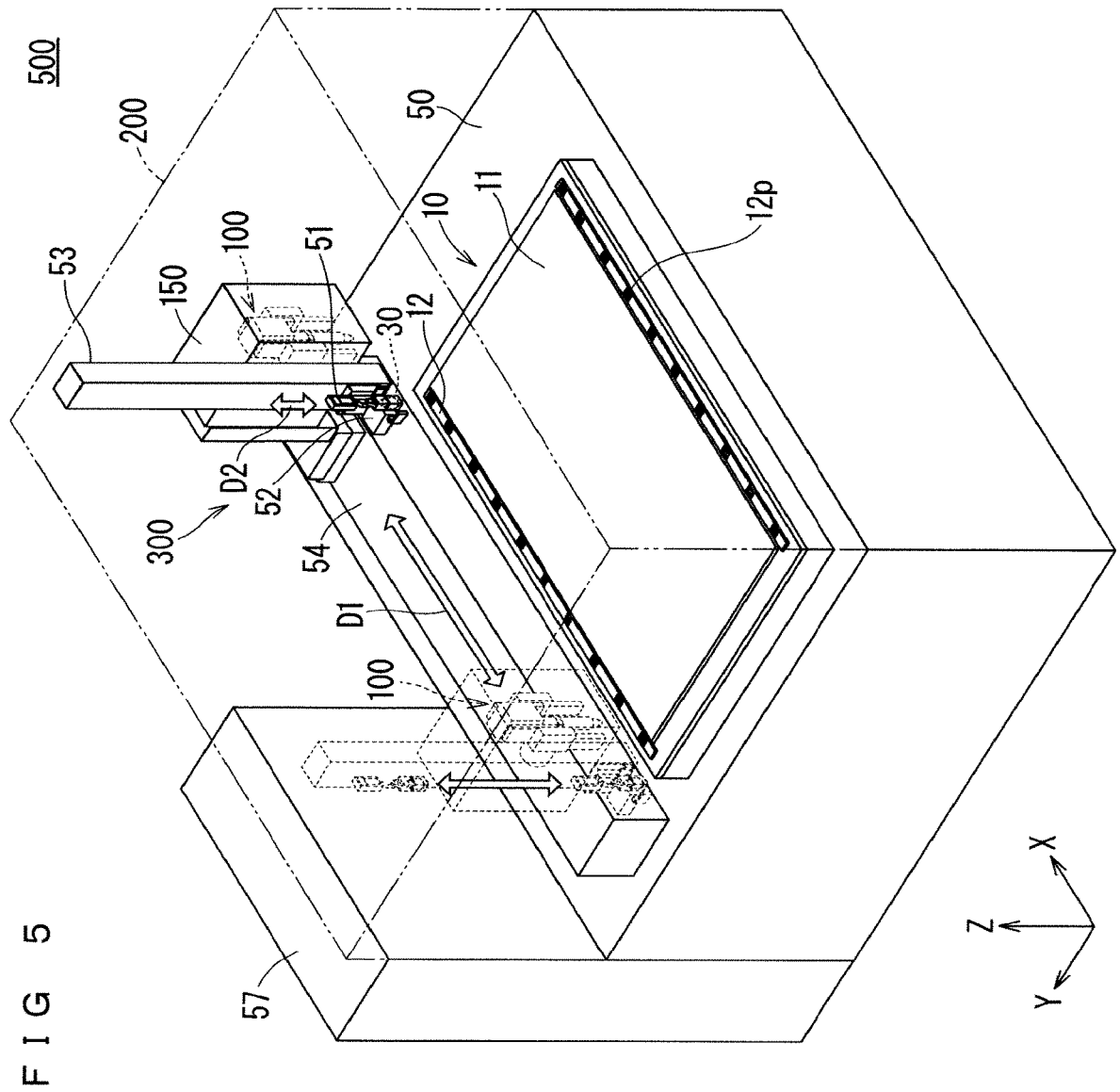
FIG. 5 is an explanatory view schematically showing a configuration of an ultrasonic vibration bonding system.

FIG. 5 is an explanatory view schematically showing a configuration of an ultrasonic vibration bonding system 500 including the ultrasonic vibration bonding apparatus 100 shown in FIG. 6 and the peeling inspection apparatus 300 shown in FIG. 1. FIG. 5 shows a state in which the ultrasonic vibration bonding apparatus 100 is stored in a bonding apparatus storage unit 150. Hereinafter, features of the ultrasonic vibration bonding system 500 will be mainly described, and description of other parts will be omitted as appropriate by attaching the same reference signs.

As shown in FIG. 5, the peeling inspection apparatus 300 and the ultrasonic vibration bonding apparatus 100 are stored in an apparatus housing 200, and, in addition to the substrate table 10, the peeling inspection apparatus 300 and the ultrasonic vibration bonding apparatus 100 are provided on the placing table 50.

An ultrasonic bonding control apparatus 57 functions not only as the above-described functions of the peeling and grasping control unit and the peeling strength measuring control unit but also as an ultrasonic vibration bonding control unit that controls the ultrasonic vibration operation performed by the ultrasonic vibration bonding apparatus 100.

Therefore, under the control of the ultrasonic bonding control apparatus 57, the ultrasonic vibration bonding system 500 can cause the ultrasonic vibration bonding apparatus 100 to execute the ultrasonic vibration operation by using the lead wire 12 disposed on the glass substrate 11 as the bonding object and can therefore bond the lead wire 12 onto the glass substrate 11.

Further, under the control of the ultrasonic bonding control apparatus 57, the ultrasonic vibration bonding system 500 can cause the peeling inspection apparatus 300 to execute the peeling strength measuring process by using the lead wire 12 already ultrasonically bonded onto the glass substrate 11 as the measuring object. That is, the ultrasonic vibration bonding system 500 can cause the chucking hand mechanism 30 to peel the tip portion of the lead wire 12 and grasp the tip portion and then execute the peeling strength measuring process for measuring the peeling strength of the lead wire 12 by using the force gauge 51.

As described above, the ultrasonic Vibration bonding system 500 can execute the peeling strength measuring process by the peeling inspection apparatus 300 and the ultrasonic vibration operation by the ultrasonic vibration bonding apparatus 100 by using the same lead wire 12 as a processing object.

Therefore, the ultrasonic vibration bonding apparatus 100 can ultrasonically bond the ultrasonic bonding point 12p of the lead wire 12 on the glass substrate 11 by using the lead wire 12 disposed on the glass substrate 11 as the bonding object, and thereafter can measure the peeling strength of the lead wire 12 by using the ultrasonically bonded lead wire 12 as the measuring object.

Although the present invention has been described in detail, the above description is illustrative in all aspects, and the present invention is not limited thereto. It is understood that countless modification examples that are not illustrated can be made, without departing from the scope of the present invention.

The invention claimed is:

1. A peeling and grasping apparatus that executes a peeling and grasping process for peeling and grasping a measuring object bonded onto a substrate in a predetermined direction, the peeling and grasping apparatus comprising:
a chucking hand mechanism;
a moving mechanism configured to execute horizontal moving operation for moving said chucking hand mechanism in a horizontal direction and vertical moving operation for moving said chucking hand mechanism in a vertical direction; and
a peeling and grasping control unit configured to control said chucking hand mechanism and said moving mechanism to control execution of said peeling and grasping process, wherein
said chucking hand mechanism includes
a contact roller having a processed outer peripheral surface that is a part of an outer peripheral surface and that is processed to be uneven,
a grasping mechanism configured to perform grasping operation in conjunction with rotation operation of said contact roller, and
a pressurizing mechanism configured to execute lowering operation of said contact roller and pressurizing operation for pressurizing said contact roller downward while said measuring object is in contact with said contact roller, and
said peeling and grasping process executed under the control of said peeling and grasping control unit includes the steps of:
(a) causing said moving mechanism to execute said horizontal moving operation and said vertical moving operation to dispose said contact roller above a tip portion of said measuring object,
(b) causing said pressurizing mechanism to execute said lowering operation to bring the outer peripheral surface of said contact roller into contact with a surface of said measuring object and causing said pressurizing mechanism to execute said pressurizing operation to set a processed surface contact state in which said processed outer peripheral surface of said contact roller and the surface of said measuring object are in contact with each other, and
(c) causing said moving mechanism to execute said horizontal moving operation while maintaining said processed surface contact state and executing contact roller rotation operation for moving said contact roller in said predetermined direction on the surface of said measuring object while rotating said contact roller, the tip portion of said measuring object being peeled from said substrate during execution of said step (c), and
(d) causing said grasping mechanism to execute said grasping operation for grasping the tip portion of said measuring object peeled from said substrate.

2. The peeling and grasping apparatus according to claim 1, wherein
said grasping mechanism includes
said contact roller,
a contact roller interlocking cam provided to be rotatable simultaneously with said contact roller, the contact roller interlocking cam having a first outer peripheral surface having a first radius from a rotation center, and having a second outer peripheral surface having a second radius longer than said first radius, and
a fixing member having a protruding end protruding in a direction toward said first and second outer peripheral surfaces of said contact roller interlocking cam and a grasping surface that is provided to face the outer peripheral surface of said contact roller and that has a shape matching with a part of the outer peripheral surface of said contact roller, grasping force of said grasping surface to the outer peripheral surface of said contact roller is applied to said fixing member,
in the execution of said step (c), a gap in which the peeled tip portion of said measuring object is allowed to exist is secured between a surface of said contact roller and said grasping surface by bringing said second outer peripheral surface of said contact roller interlocking cam and said protruding end into contact with each other, and in the execution of said step (d), said grasping operation is executed by bringing said first outer peripheral surface of said contact roller interlocking cam and said protruding end into contact with each other and sandwiching the peeled tip portion of said measuring object between the outer peripheral surface of said contact roller and said grasping surface while applying said grasping force to said fixing member.

3. A peeling inspection apparatus comprising:

the peeling and grasping apparatus according to claim 1;

a peeling strength measuring instrument coupled with said chucking hand mechanism; and a peeling strength measuring control unit configured to control said peeling strength measuring instrument to control execution of a peeling strength measuring process for measuring peeling strength of said measuring object, wherein said peeling strength measuring process executed under the control of said peeling strength measuring control unit includes the steps of:

(x) causing said peeling and grasping apparatus to execute said peeling and grasping process, and (y) after execution of said step (x), releasing said chucking hand mechanism from at least said horizontal moving operation of said moving mechanism, and measuring the peeling strength of said measuring object by using said peeling strength measuring instrument.

4. An ultrasonic vibration bonding system comprising:

the peeling inspection apparatus according to claim 3; and an ultrasonic vibration bonding apparatus configured to execute ultrasonic vibration operation with respect to a bonding object disposed on said substrate to bond said bonding object onto said substrate.

* * * * *